(12) United States Patent
Gregor

(10) Patent No.: US 6,222,407 B1
(45) Date of Patent: Apr. 24, 2001

(54) DUAL MODE PROGRAMMABLE DELAY ELEMENT

(75) Inventor: Roger Paul Gregor, Endicott, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/263,035

(22) Filed: Mar. 5, 1999

(51) Int. Cl.$^7$ .................................................. H03H 11/26
(52) U.S. Cl. ........................................... 327/269; 327/270
(58) Field of Search .................................. 327/262, 263, 327/269, 270, 276, 272, 278

(56) References Cited

U.S. PATENT DOCUMENTS

| | | | |
|---|---|---|---|
| 3,544,908 | 12/1970 | Wood et al. | 328/120 |
| 4,626,716 | * 12/1986 | Miki | 307/590 |
| 5,095,233 | 3/1992 | Ashby et al. | 307/603 |
| 5,210,450 | 5/1993 | Parkinson | 307/603 |
| 5,355,097 | * 10/1994 | Scott et al. | 331/1 A |
| 5,365,130 | 11/1994 | Murray et al. | 327/278 |

\* cited by examiner

Primary Examiner—Toan Tran
Assistant Examiner—Linh Nguyen
(74) Attorney, Agent, or Firm—McGuireWoods, LLP; John R. Pivnichny, Esq.

(57) ABSTRACT

Rapid set-up is achieved in a programmable delay element having identical pairs of positionally corresponding delay stages in parallel arrays. The pairs of delay elements include identical arrangements of circuit elements and are replicable in a step-and-repeat fashion to simplify delay element manufacture for any arbitrary maximum delay time to be provided. Delay stages of the delay element are comprised of multiplexers. Outputs of respective delay stages are simultaneously stored as a signal transition is propagated through the delay stages in a first order to program the delay element. Thereafter, signals are propagated through selected delay stages in a second order controlled by the simultaneously stored outputs of respective delay stages during the propagation of the signal transition. The selected stages through which a signal is propagated in the second order are the same stages through which the signal transition had propagated in the first order at the time the delay stage outputs were simultaneously stored.

18 Claims, 7 Drawing Sheets

DUAL MODE PROGRAMMABLE DELAY

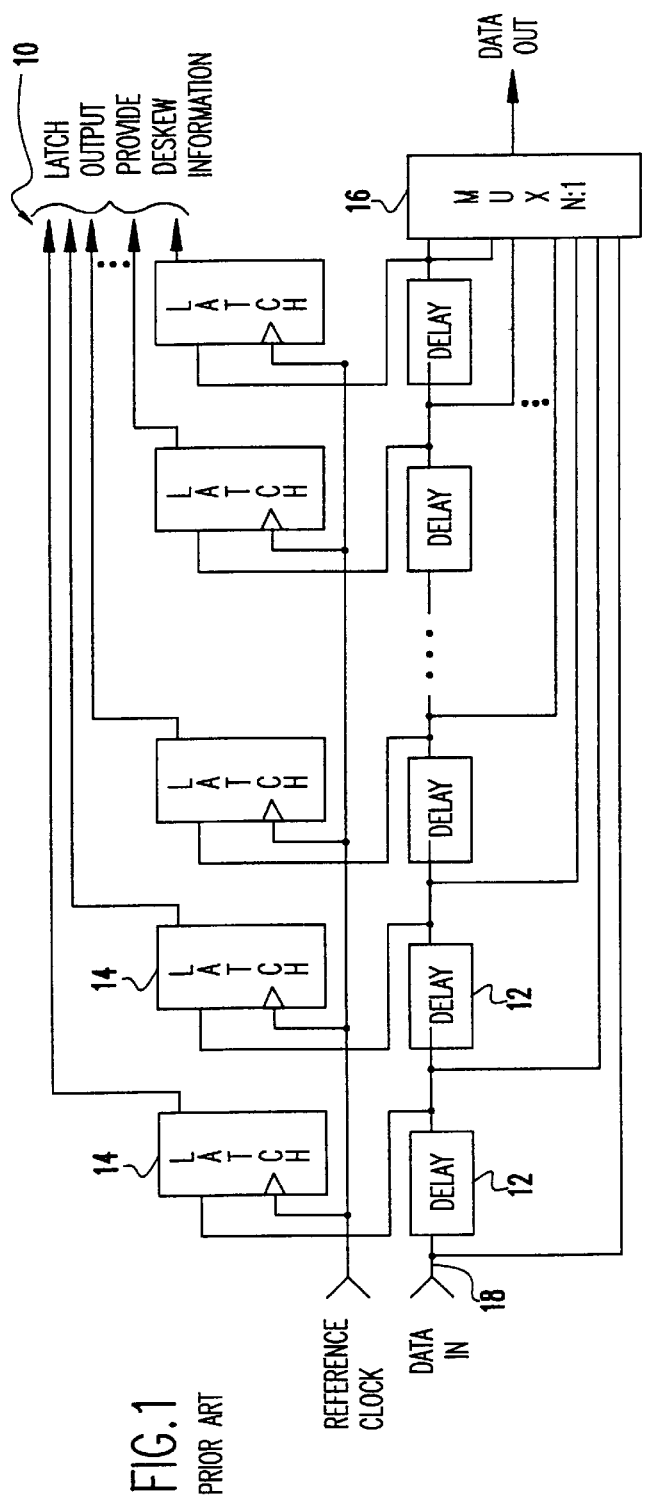
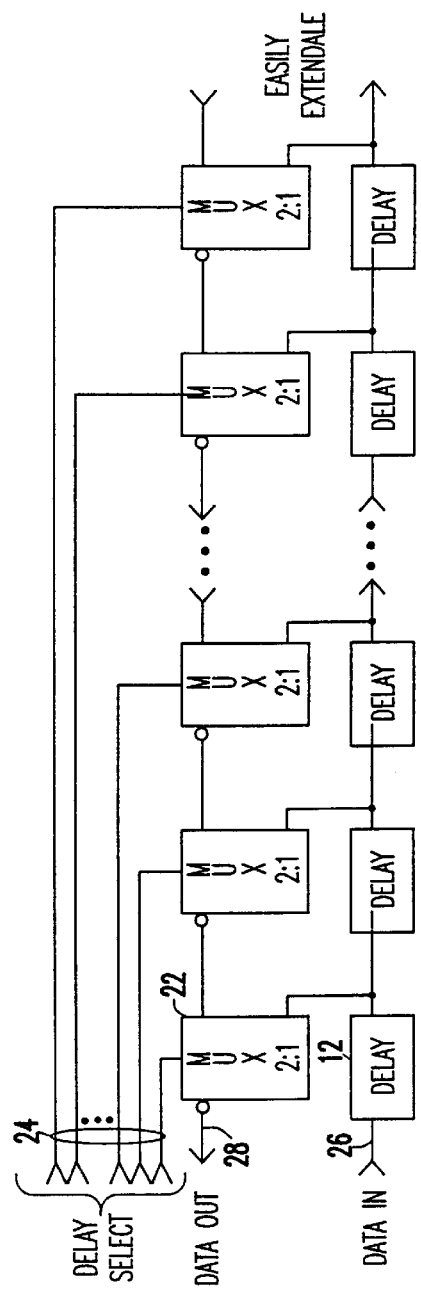
FIG.1 PRIOR ART
FIG.2 PRIOR ART

FIG.3 DUAL MODE PROGRAMMABLE DELAY

DUAL MODE PROGRAMMABLE DELAY ELEMENT

BACKGROUND OF THE INVENTION

1. Field of the Invention

The present invention generally relates to digital circuits for providing delay of digital signals and, more particularly, to programmable delay elements for correction and synchronization of propagation times of digital signals.

2. Description of the Prior Art

Modern digital logic circuits, such as those used in digital data processors, are characterized by short signal propagation times which are enhanced by decreased switching element (e.g. transistor) sizes and increased integration density. The short signal propagation times are exploited by reducing clock cycle times so that logic functions and data processing can be carried out more rapidly.

However, signal propagation time is necessarily finite and non-uniform due to capacitances and resistances of interconnections and other loads such as those presented by the gates of CMOS devices which are currently the logic circuit technology of choice for most digital circuits and the signal propagation time within the circuits, themselves. The non-uniformity of signal propagation time has increased with digital processor complexity and burdensome design analyses are generally required to determine critical signal paths and maintain propagation time within tolerances in those critical paths. Even non-critical paths may present problems and cause errors of logic function in relatively simple circuit configurations and which cannot be reliably predicted.

Consider, for example, a circuit in which two related signals are propagated in parallel such as respective bits of a single byte of binary code representing a character or number. If a logical combination of those two signals or bits is to be done, it is clearly imperative that both signals or bits be present and determinable as being of the appropriate logic state when the logic function is allowed to occur in order to avoid errors. Of course, it would be possible to latch signals at each point of the propagation path or to delay the logical operation until all signals are unconditionally settled to a stable logic state.

However, either such possibility would greatly reduce the operational speed of the overall logic circuit or processor. Thorough design analysis and adjustment of propagation time of each node of each signal propagation path would be economically prohibitive and does not guarantee the performance of the circuit. Accordingly, it is common practice to provide programmable delay elements in such signal paths to delay selected ones of related signals to correspond to the last to arrive in order to automatically synchronize their arrival at a particular node.

In general, it is also common practice to generate delays in digital signals by propagating signals through a plurality of rapidly switched identical stages such as serial pairs of inverter circuits and which are arrayed such that propagation time over connections between stages is substantially constant. While some variation in propagation time is inevitable, the propagation time through a pair of inverters is a sufficiently small time increment to approximate the required delay with a resolution which is short compared to clock cycle time. However, since propagation time may vary between stages and collectively over a plurality of stage (e.g. due to temperature, supply voltage and other operational and environmental conditions, it is generally necessary to provide for empirical determination of the number of stages which will provide a required delay period at any given time in order to suitably program a delay element.

The ability to program such delay elements potentially reduces the design burden of designing particular delay elements for each node of a circuit path. However, it should be appreciated that delay elements can consume significant amounts of chip space, depending on the maximum amount of delay to be accommodated. While the maximum delay can be estimated, the maximum delay must be matched fairly closely with the actual delay in order to avoid excessive consumption of chip space and specific designs of delay elements for specific maximum delays may be required, depending on other operational constraints such as so-called set-up time.

That is, if delays are reasonably stable, it may be acceptable from a circuit design point of view to more-or-less permanently program the delay element with a few bits of read only memory or to use some type of propagation time monitoring and data collection circuit (external to the delay element) which adjustably reprograms the delay element based on some statistical criteria in regard to error rate, propagation time variation, external conditions such as supply voltage or temperature or the like. This type of expedient allows the delay element to be physically formed on a chip in a step-and-repeat fashion since the delay stages may be made identically and the programming arrangement merely gates the output of each stage appropriately to derive the output from the stage which will provide the needed delay, such as by providing a simple multiplexer at each stage of the delay element.

On the other hand, there are many applications in which operation time is sufficiently critical that reprogramming is desirable upon the detection of any error and must be completed based on a single measurement or detection of actual propagation time, such as by sending a single signal transition through the delay element. Circuit designs capable of such a short set-up time are substantially more complex since they must internally measure signal propagation time through the delay element and immediately adjust the location at which the output is to be taken. It is also necessary to provide equal delay from each tap of the delay line to the output of the multiplexer including the connections from the delay elements to the multiplexer inputs and accommodation of this requirement increases the complexity of the delay element design and requires unique layouts for delay elements of each different maximum delay to be produced.

To do this, it has been considered necessary to store propagation time information in the delay element and to use a single multiplexer having a number of inputs equal to the number of delay stages which is responsive to the stored propagation time data. This latter requirement prevents the delay element to be physically produced by the simple step-and-repeat fashion alluded to above since a different multiplexer design must be provided for each maximum delay. Again, there is a trade-off between chip space and the number of multiplexer designs which may be required in the overall logic circuit or processor design.

In summary, fast set-up time and ease of extendibility of the delay element architecture have been mutually exclusive. This mutual exclusivity can be readily understood from the fact that provision of a simple multiplexer at each stage of the delay element requires serial propagation of signals through a number of the multiplexers. Thus the propagation time through the serial chain of multiplexers after the signal has been tapped from one of the serially connected delay stages precludes the propagation time through the serially connected multiplexers from being directly measured consistent with propagation time data being stored in a latch in a replicable delay element stage. Therefore, a search for the correct stage at which to tap a signal from the delay line requires a number of repetitions to achieve the correct total delay through both a serial array of delay elements and a serial array of multiplexers. Viewed in a slightly different way, the circuit designer must choose between complexity of delay element circuit design and layout and complexity of set-up to achieve correct programming to achieve the required delay.

SUMMARY OF THE INVENTION

It is therefore an object of the present invention to provide a delay element capable of internal measurement of propagation time and internal storage of propagation time data to support set-up based on propagation of a single signal transition while being composed entirely of replicable stages.

It is another object of the invention to provide a programmable delay element capable of providing delays with a resolution of less than the propagation delay of a single, replicable, circuit.

In order to accomplish these and other objects of the invention, a programmable delay element is provided having a plurality of delay stages having substantially equal propagation delay times, and selective interconnections of the plurality of delay stages to form a first signal propagation path through all delay stages in a first order or a second signal propagation path in a second order through a selected plurality of delay stages to an output terminal and including the same delay stages as a portion of the first signal propagation path.

In accordance with another aspect of the invention, a method of operating a programmable delay element is provided including steps of propagating a signal transition through delay stages in a first order, simultaneously storing outputs of respective delay stages, and propagating a signal through selected ones of said plurality of delay stages in a second order to an output.

BRIEF DESCRIPTION OF THE DRAWINGS

The foregoing and other objects, aspects and advantages will be better understood from the following detailed description of a preferred embodiment of the invention with reference to the drawings, in which:

FIG. 1 is a schematic diagram of a conventional delay element having internal delay measurement and propagation time data storage and programming to provide short set-up time, FIG. 2 is a schematic diagram of a conventional delay element having external programming and replicable stages and requiring extended set-up time.

DETAILED DESCRIPTION OF A PREFERRED EMBODIMENT OF THE INVENTION

Figure 3:
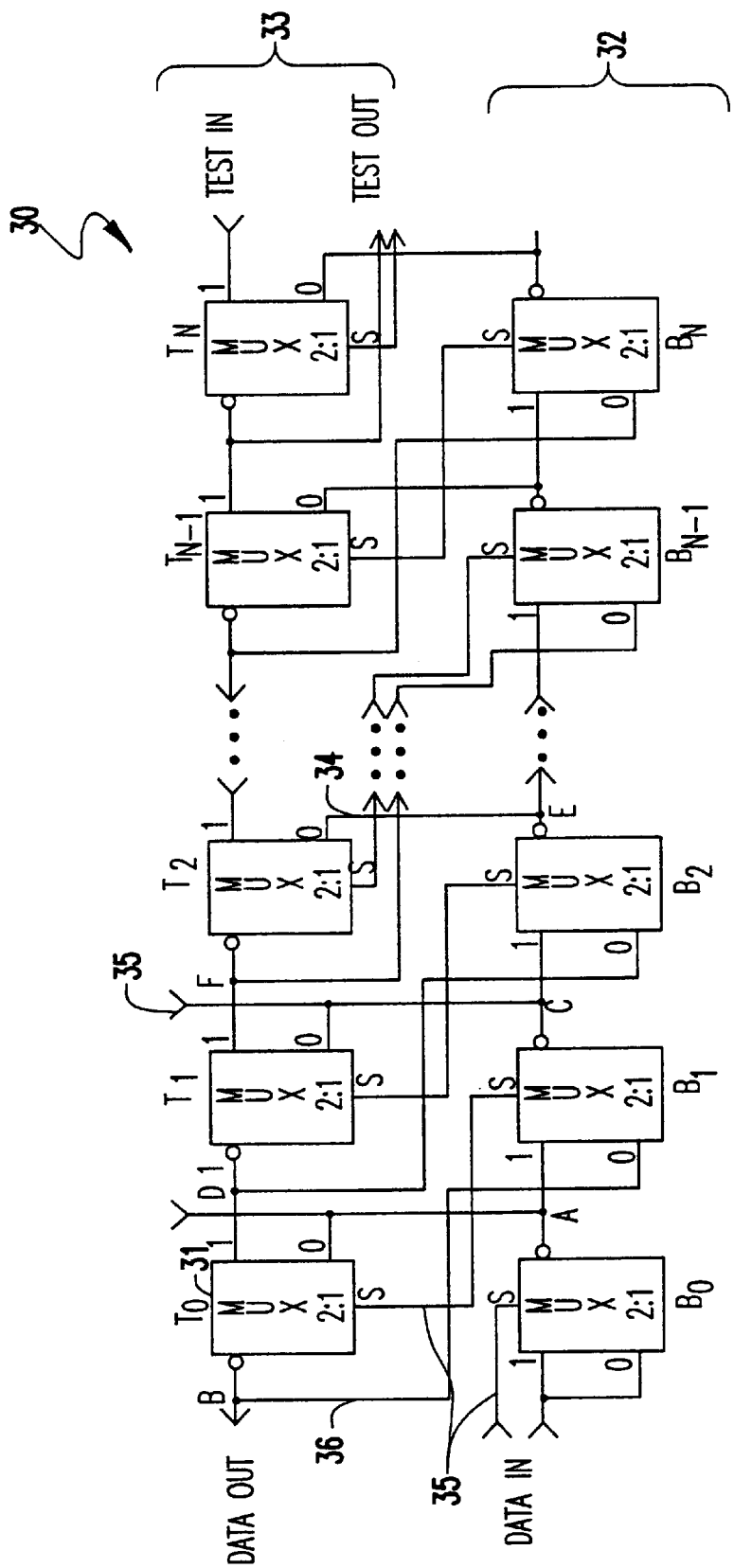
FIG. 3 is a schematic diagram of the delay element array in accordance with the present invention, omitting programming latches for clarity.

Referring now to the drawings, and more particularly to FIG. 1, there is schematically shown a representation of a conventional programmable delay element 10 exemplary of known delay elements supporting fast set-up time. In delay element designs of this type, a plurality of serially connected delay stages 12 with nodes connecting the delay stages (and, generally, the input and output) connected to respective inputs of multiplexer 16 which is controlled by outputs of latches 14.

In operation, a signal transition is launched into the serially connected delay stages 12 from input 18 with the inputs to latches 14 enabled. The inputs to the latches 14 are then disabled by a reference clock and the signal is stored in a latch (or plurality thereof) corresponding to the output of the delay stage 12 which the signal transition has reached. The output of the latch which indicates the signal transition thus controls the multiplexer 16 to select and connect the delay element output to the output of the corresponding delay stage 12. Programming of the circuit of FIG. 1 will thus have been achieved and input signals will thereafter be delayed by the time difference between the input signal transition and the reference clock which disables the inputs to the latches 14 until the delay element is reprogrammed, such as upon detection of a subsequent error indicating a need for a different delay period than previously used.

As alluded to above, while a delay element 12 and latch 14 are provided for each stage (and are potentially replicable in a step-and-repeat fashion), this delay element design relies upon the ability to produce the identical propagation time from the output of each delay stage to the output of the multiplexer. In this regard, it should be noted that the multiplexer input selected may compensate for the propagation delay in the multiplexer, itself, and over inputs thereto (which is not measured during set-up) if a substantially identical propagation delay is provided over multiplexer input connections. This requirement thus imposes serious constraints on the layout of the multiplexer inputs in addition to the requirement that the number of multiplexer inputs correspond to the number of delay stages 12. Therefore, each maximum delay which is to be accommodated requires a delay element design in which the multiplexer design and input layout is unique.

In contrast and with reference to FIG. 2, a conventional programmable delay element having replicable stages but requiring an extended set-up time is shown. Similar to the circuit of FIG. 1, this type of programmable delay element includes a plurality of serially connected delay stages 12. To include replicable stages, a two-input multiplexer 22 is also provided for each delay stage. the multiplexers 22 are respectively controlled by external programming inputs 24 such that, when a multiplexer is selected by an appropriate input 24 an input signal 26 to the serially connected delay elements 12, the delayed signal will be tapped from a selected output of a delay stage 12 and will loop back through the serially connected multiplexers 22 to output 28.

As alluded to above, this architecture, while simple and easily replicable by step-and-repeat layout of stages, does not allow direct internal measurement of overall delay since the propagation path includes a variably located path from a delay stage to a multiplexer stage and thus both the portion of the delay stage array and the multiplexer array will be of variable length; requiring the total delay to be measured for individual interconnections between the delay stage path and the multiplexer path. (Even if a pulse were to be input, all taps activated to produce a series of pulses and the pulses counted at the output relative to a reference clock, the result would not be accurate since the delay stage output loading and, hence, the propagation time of respective delay stages 12 would be altered.) Accordingly, the total delay must be iteratively compared with a reference clock and may require as many iterations as the number of delay stages 12; resulting in an extended set-up time.

Figure 4:
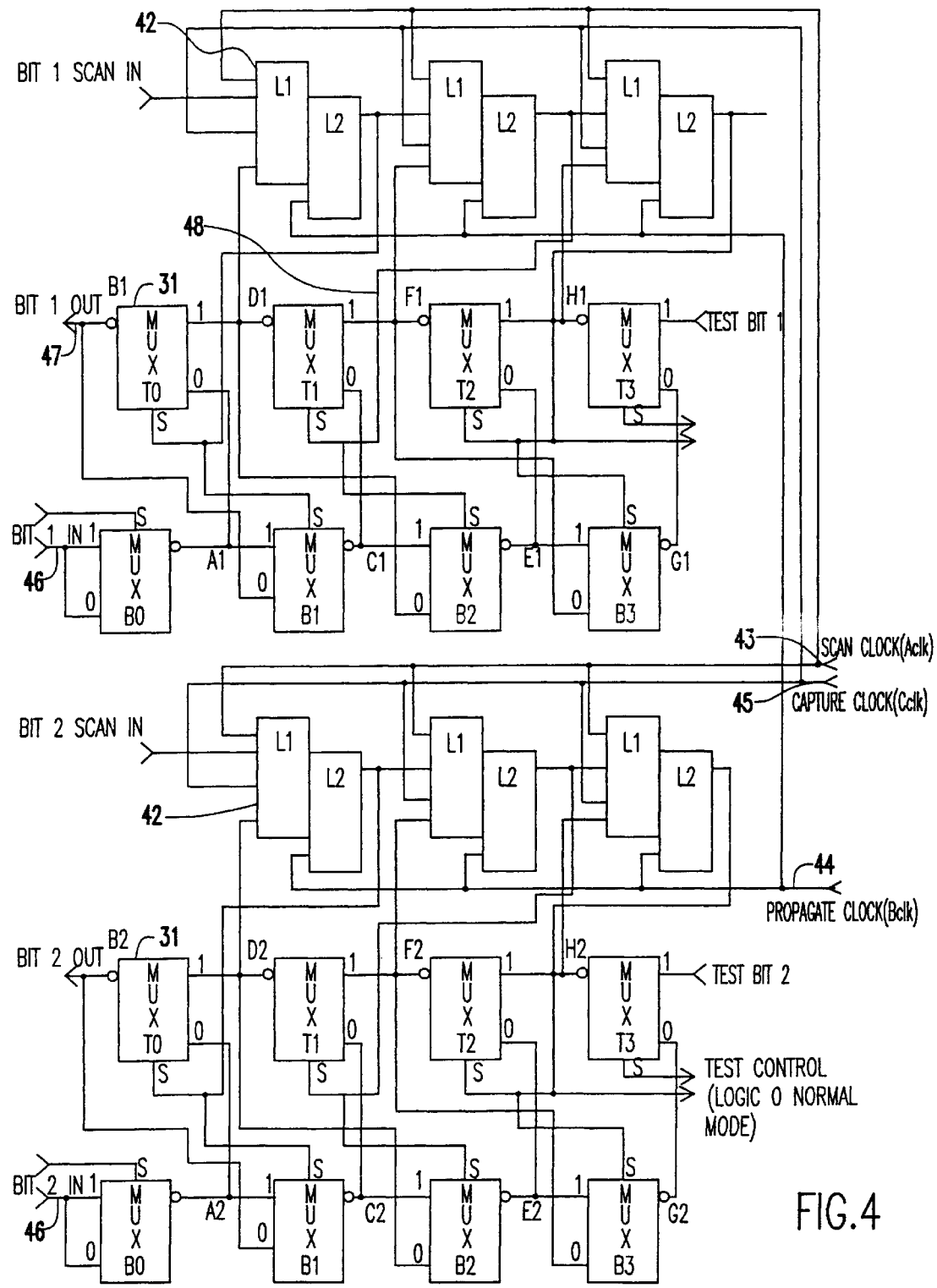
FIG. 4 is a schematic diagram of a preferred implementation of the invention for synchronization of two parallel-transmitted bits.

Referring now to FIG. 3, the dual mode programmable delay element 30 in accordance with the invention is partially shown. The latches for comparison of delay with a reference clock are omitted from FIG. 3 in the interest of clarity but are illustrated in FIG. 4 and will be explained in detail below with reference thereto.

Initially, it is to be observed that the delay stages of the invention are preferably formed entirely of multiplexers 31. As alluded to above, delay stages may be formed of any digital circuit that switches rapidly relative to a clock cycle so that a desired delay may be adequately approximated by an integral multiple of the propagation time of a single stage.

Pairs of inverters are often used to provide signal reshaping at each stage. However, multiplexers are particularly advantageous in the present invention since, when implemented in CMOS technology, they basically comprise a pair of transmission gates and are a particularly simple circuit with a small footprint on the chip. Inverter circuits can easily be combined therewith or periodically for signal reshaping. As will be discussed further below, the signal traverses an equal number of inverting multiplexers in both directions and differences in Nfet and Pfet gain are cancelled out and implementations of the device are relatively insensitive to process variations. Although a CMOS inverter provides the shortest possible delay per stage with reshaping, the combination of a transmission gate multiplexer and an inverter provides only a slightly longer delay per stage. Thus, delay resolution using multiplexers and inverters in accordance with the invention is comparable to a delay line comprised of only inverters. Further, use of the same type of circuits throughout the signal path prevents alteration of output loading of respective stages regardless of how the signal path is controlled.

While layout is not critical to the practice of the invention, the circuit of FIG. 3 is illustrated as including two serial arrays 32, 33 (respectively referred to hereinafter as a forward chain 32 and a backward chain 33) of multiplexers, as has been found to be convenient. A crossing connection is provided at each stage of the backward and forward chains. Select inputs are provided in common to pairs of multiplexers 31 of each chain but are skewed by one stage between respective stages of respective chains such that the last multiplexer of the backward chain is commonly controlled with the second stage of the forward chain, the next-to-last stage of the backward chain is commonly controlled with the third stage of the forward chain and so on. Further cross-connections 36 between the forward and backward chains are provided in accordance with the same stages which are commonly controlled (e.g. skewed by one stage between chains).

It can be appreciated that this pattern of connections is geometrically repeatable in the same manner as the multiplexer circuits and is readily extendable in a step-and-repeat fashion. The connection layout is thus standardized and substantially identical propagation times therein is assured. In this regard, it may be advantageous to offset the layout of the forward and backward multiplexer chains to equalize the length of crossover connections 34 and 36. The selection connections 35 are preferably brought out between the stages of either the forward or backward chains.

The delay element in accordance with the invention is referred to as a dual mode delay element because the above-described circuits and connection (which can be implemented in many forms by those skilled in the art in view of the present explanation thereof) provide two alternative signal propagation paths depending on multiplexer control signals 35. In this regard, it should be appreciated that the partial illustration of the invention provided in FIG. 3 functionally corresponds to the illustration of FIG. 2 insofar as the programming structure is omitted from both Figures. However, in contrast with the exemplary delay element of FIG. 2 in which the inclusion of latches for rapid set-up programming could not be included, the alternative signal paths of FIG. 3 allow inclusion of latches to support rapid set-up to be readily achieved.

Specifically, some of the individual multiplexers 31 of FIG. 3 are identified by the reference letters A–F. For convenience, the two signal paths provided by the invention will be referred to hereinafter as the forward signal path through the multiplexer sequence A, B, C, D, E, F, . . . (e.g. criss-crossing between multiplexer arrays and continuing therethrough) and the feedback signal path A, C, E, . . . F, D, B (e.g. generally counter-clockwise around a limited portion of the arrays and crossing between the arrays only once. It should be appreciated that the forward signal path will extend through the entireties of both multiplexer arrays while the feedback path will return the signal to an output terminal regardless of the portion of the multiplexer arrays which is traversed. Further, it should be appreciated that any given portion of the arrays will have the same number of multiplexers in both the forward and feedback paths.

(The test input and output shown in FIG. 3 are not required for the practice of the invention in accordance with the basic principles thereof and are not used in the normal operation thereof as described herein, they provide a convenient arrangement for verification of the DC functionality of the entire chain of delay stages in the delay element of the invention. Varying combinations of inputs at the Data In, Test In and Delay Element Select inputs can be applied while monitoring the Data Out and Test Out connections to ascertain that all elements switch properly.)

These features of the respective signal paths can be exploited to provide rapid set-up in a manner which will now be discussed with reference to FIGS. 4 and 5. It may be helpful to recall that, in the above discussion of FIG. 1, the signal transition was launched into the input, propagated through the serial connection of delay stages an latched in response to a reference clock signal at whatever stage the signal transition had reached in order to take the output from a corresponding delay stage by appropriate control of the multiplexer by the latches.

In contrast, the basic principle of operation of the present invention is to propagate a signal transition through the forward path (A, B, C, D, E, F, . . . ) and to latch the signal transition at the stage in the forward path that the signal transition has reached at the time a reference clock signal occurs. The latch which stores the signal transition thereafter controls the location of the crossover between the forward and reverse arrays along the feedback signal path (A, C, E, . . . F, D, B) which will include the same number of stages traversed by the signal transition between the time of its launching into the forward path and the time of the reference clock signal.

In this way, the use of a single multiplexer for selectively tapping the delay stage array is avoided and the signal is routed to a single output terminal regardless of the portion of the forward and reverse paths the signal traverses. Further, the entire signal path propagation time is measured during the set-up which was unavailable in circuits of the type of FIGS. 1 and 2, whereas the multiplexer and input thereto which is selected are not active in the rapid set-up procedure of the circuit of FIG. 1. Moreover, there is no criticality of layout or multiplexer design in the present invention but which is characteristic of circuits of the type shown in FIG. 1. All portions of the distributed multiplexer of the invention are preferably identical.

Referring now to FIG. 4, an embodiment of the invention is shown which employs level sensitive scan design (LSSD) latches which can be loaded from either a data port or a scan port for convenience of testing and to reset the programmable delay line. (As shown, a logical "0" on the select inputs puts the multiplexer into the forward mode as required at the start of the fast set-up operation. By scanning a logical "0" into all latches, the programmable delay element can be reset to the preferred state for the start of the fast set-up operation. Any other combination of logic states can be scanned into the latches to preset the multiplexers to a known state for either test or functional operation.) However, the specifics of the latches are not critical to the practice of the invention in accordance with its basic principles. For example, flip-flop circuits of any type or design are also entirely adequate to the practice of the invention.

The circuit of FIG. 4 is limited to two delay elements for the synchronization of two signals but can be expanded to as many signals as desired or further limited to a single signal. As can be readily seen from a comparison of FIG. 4 and the partial illustration of the invention of FIG. 3, a latch 42 is provided for each pair of multiplexers in the forward and reverse multiplexer arrays (i.e. a pair comprising one multiplexer from each of the forward and reverse multiplexer arrays). As alluded to above, the latches 42 serve to store the delay time information from a fast set-up operation (using the forward signal path) and thereafter control the crossover location from the forward to the reverse multiplexer while the delay element is operated to propagate signals along the feedback path to thereby control the delay path length. This operation will now be discussed with reference to FIG. 5. However, the details of the operation and delay element control are specific to use of LSSD latches and should be considered as exemplary of implementations using other latch designs.

Figure 5:
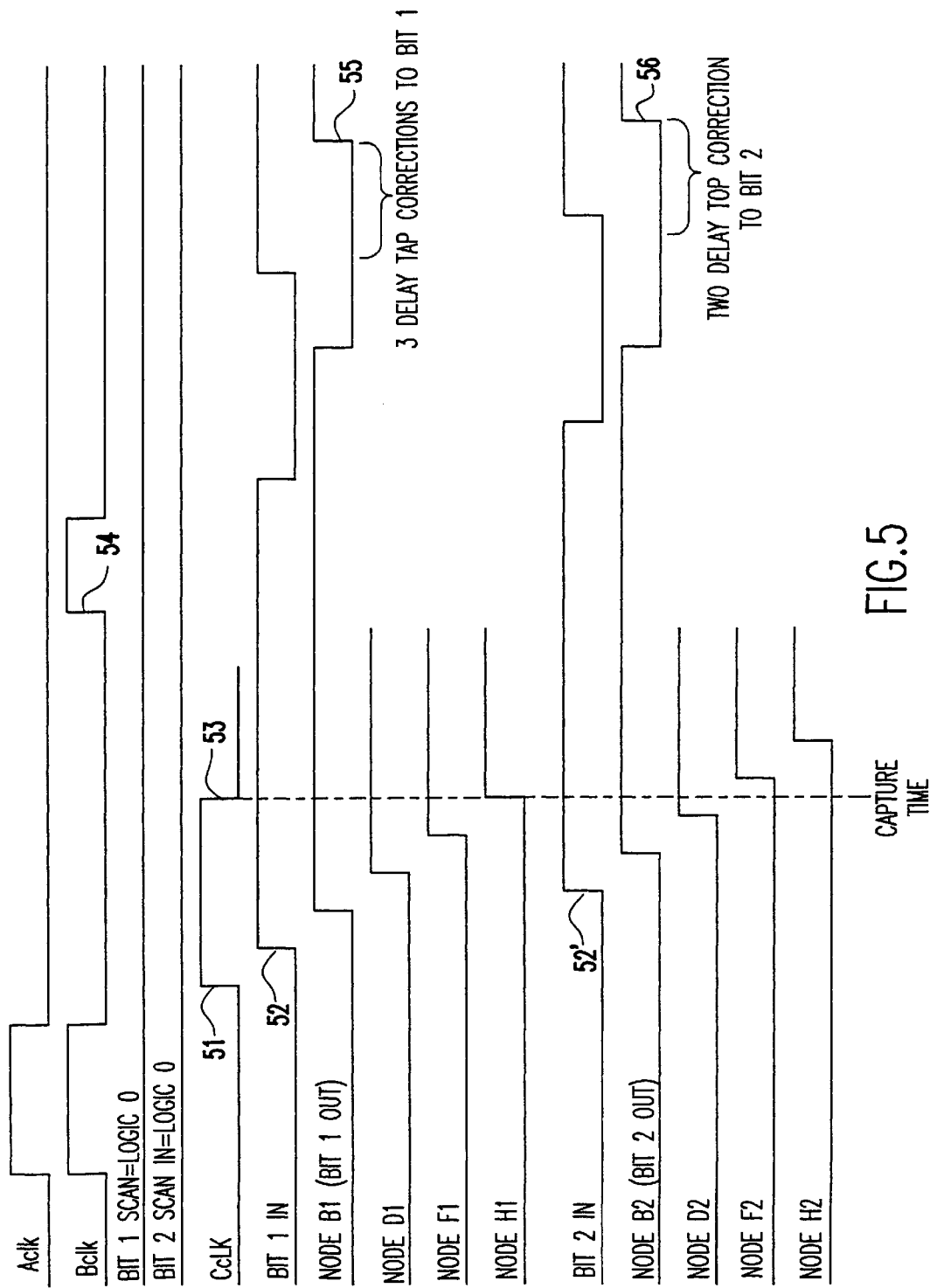
FIG. 5 is a timing diagram detailing the operation of the circuit illustrated in FIG. 4.

As shown in FIG. 5, both scan clocks, scan clock Aclk 43 and propagate clock Bclk 44, are held high while the data into the delay line is held low and the scan data into the first latch is held low. This resets all the latches to a logic zero which selects the forward path. Then, while the data is still held low, the capture clock signal Cclk 45 is brought high at 51. The data inputs 46 are then brought to a logic high at 52, 52'. An exemplary skew is shown between bit 1 (52) and bit 2 (52') transitions to logic 1 representing a path delay difference which the delay element of the invention is intended to correct. The propagation of these signals through the forward path of respective delay lines is shown by the illustration of signals at nodes B, D, F and H for the respective delay lines for bit 1 and bit 2.

When the capture clock signal Cclk returns to a low logic level at 53, each latch 42 in both delay lines stores the state of a multiplexer output. Then, bringing Bclk high transfers the multiplexer outputs to the latch outputs and generates proper select control inputs (e.g. 48) for the multiplexers: wherever a logic "1" is stored in a latch, the corresponding multiplexers are placed into the loop mode to propagate signals along the feedback path described above and where a logic "0" is stored, the delay line is left in the forward mode to propagate signals along the forward path.

Thereafter, when a data signal transition occurs it propagates through the forward multiplexer array (e.g. A, C, E, . . . ) to the point in each delay line where the multiplexer control transitions from loop mode to forward mode and then loops back through the reverse multiplexer array (e.g. . . . F, D, B). This path will include exactly the same multiplexers (both as to identity and number) as were traversed (but in a different order) by the signal transition used for the set-up operation and creates a delay which exactly matches the delay between the data and the capture clock Cclk in each delay line so that bit 1 and bit 2 are exactly realigned ("deskewed") as shown at 55, 56.

Figure 6:
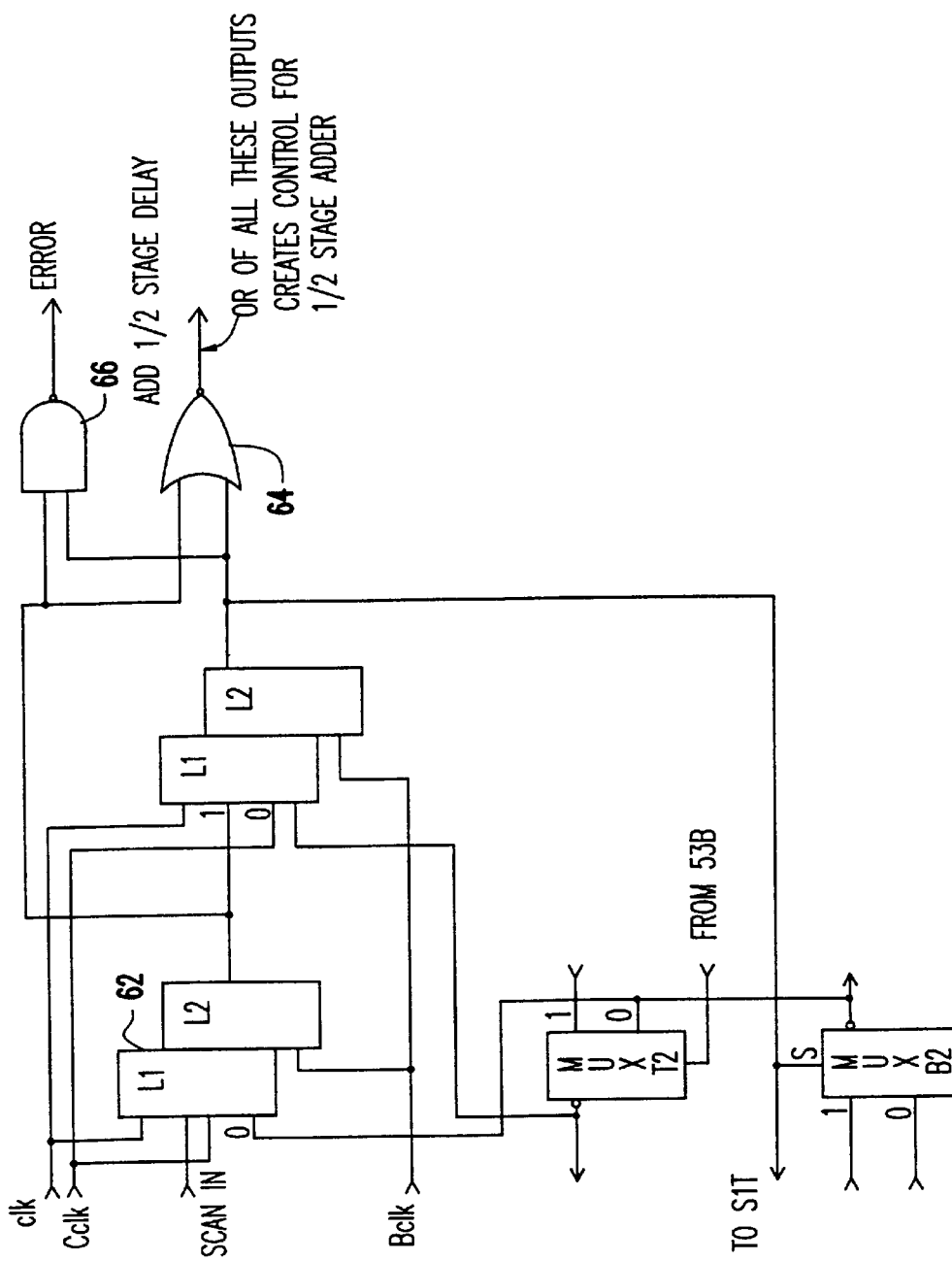
FIG. 6 is a partial schematic diagram of a perfecting feature of the invention allowing an increase of resolution of generated delay, FIG. 7 schematically illustrates an alternative implementation of the invention utilizing a different form of latches than illustrated in FIG. 4.

FIG. 6 illustrates a perfecting feature of the invention which provides twice the delay resolution of the embodiment of FIG. 4. It will be recalled that, in the embodiment of FIG. 4, the outputs of latches B, D, F, . . . , the even numbered multiplexers counted in the order of the forward signal propagation path, were monitored by the latches 42. Accordingly, the delay resolution is the sum of the propagation times of two multiplexers.

In contrast, FIG. 6 illustrates the addition of latches for the remainder of the multiplexers (e.g. A, C, E, . . . , the odd numbered multiplexers along the forward signal propagation path). However, to avoid complication of the connections discussed above in connection with FIG. 3, the output of the odd multiplexers after transfer to the latch outputs are logically combined so that when the transition corresponds to a multiplexer in the forward multiplexer array, an additional delay corresponding to the propagation time of a single multiplexer is added to the signal propagation time, preferably by adding a single further multiplexer stage delay at the data output (e.g. 47 of FIG. 4). This can be done, for example, by providing two different delays in parallel, possibly in parallel with stage B, as identified in FIG. 3 but differing by the desired single stage delay time. The output of gate 64 can then be used to select between the outputs of the two delays by using alternatively enabled transmission gates, a 2:1 multiplexer or the like.

In addition to doubling resolution, this configuration also provides the advantage of allowing extremely convenient testing for error conditions by a simple logic gate as illustrated at 66. It is not possible, consistent with correct operation, for the outputs of both multiplexers to be at, for example, a logic "1" if a transition to logic "1" is used for the set-up operation. Therefore, testing for a prohibited or impossible condition can be done very simply to detect an error condition.

Figure 7:
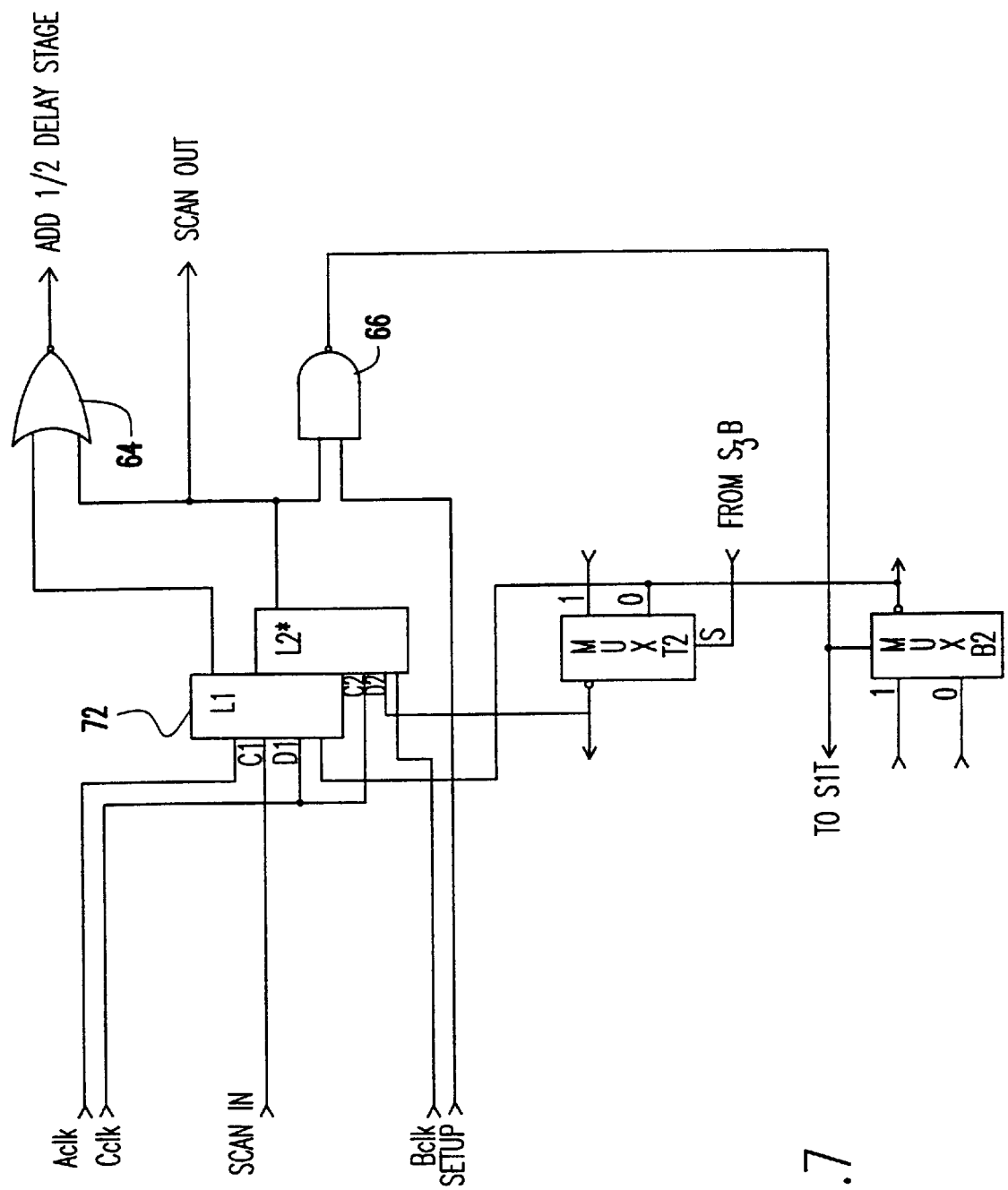

FIG. 7 shows an alternative implementation using so-called "L1L2*" latches which may be selectively made to function as either a master-slave latch for scan data derived from the set-up operation and two transparent latches for data. This type of latch allows multiplexers of both the forward and reverse multiplexer arrays to be monitored to provide doubled resolution (with gate 64) and/or error detection (with gate 66) using only a single latch 72.

Figure 8:
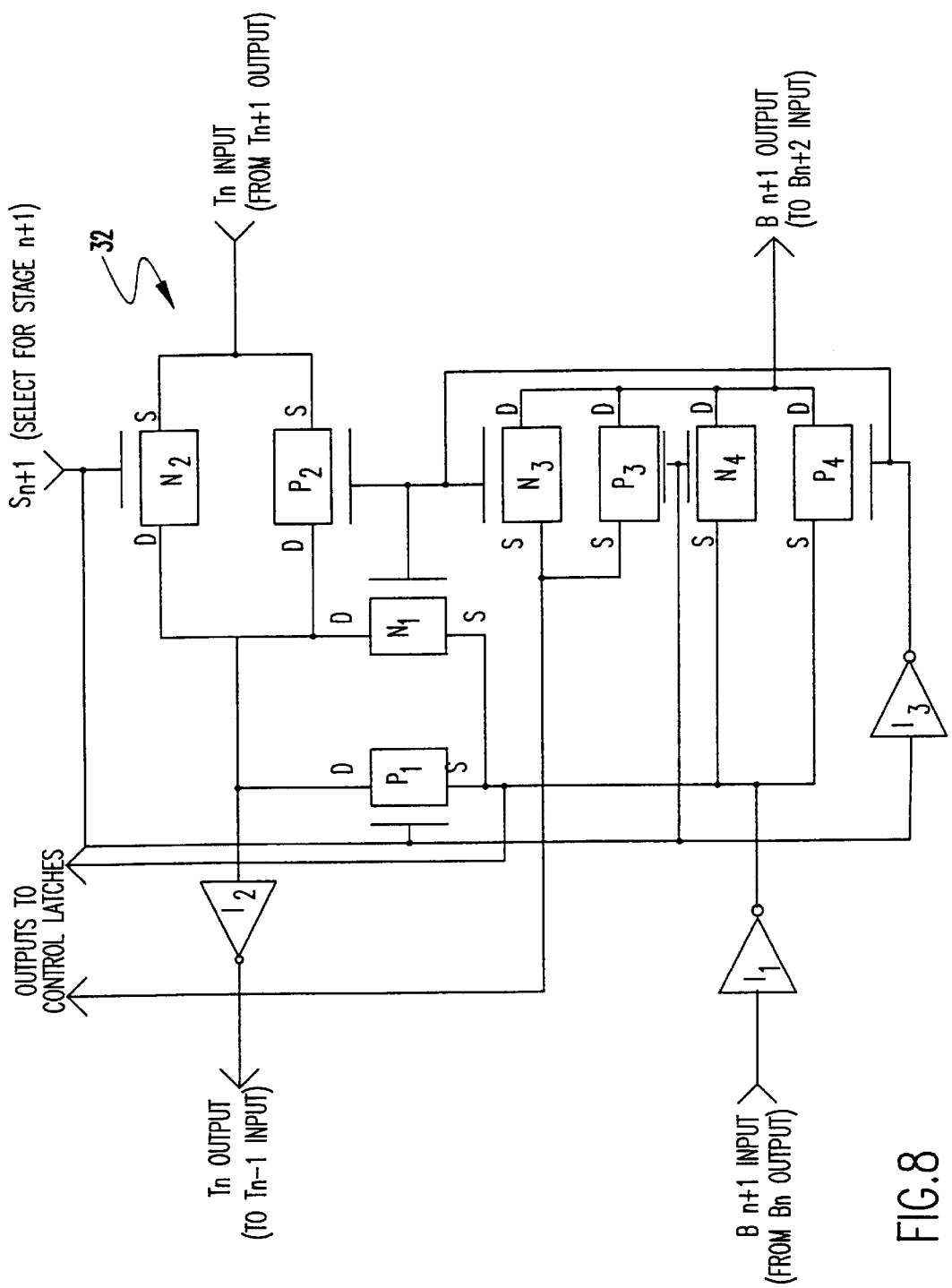
FIG. 8 is a preferred multiplexer configuration for practice of the invention.

FIG. 8 shows a preferred implementation for multiplexers 32 usable in the practice of the invention. It should be appreciated that the multiplexer circuit of FIG. 8 is a dual multiplexer functioning as a stage in each of the forward and reverse multiplexer arrays as depicted above. The circuit also includes the select function, signal redrive/reshaping functions and cross-connections between arrays discussed above.

Specifically, Nfet devices N1, N2 and Pfet devices P1, P2 form a complementary transmission gate multiplexer into the input of inverter I2 and form a stage in, for example the reverse multiplexer array. Similarly, Nfet devices N3, N4 and Pfet devices P3, P4 form the multiplexer stage in the forward multiplexer array. Inverter I3 is used to invert the select signal for the pair of stages such that when the select signal is a logic "1", each of the multiplexers accepts data from the adjacent stage of the respective forward and reverse arrays and when the select signal is a logic "0", data is transferred from the forward array to the reverse array.

That is, when the select signal is at logic "1", N2 and P2 multiplex data from the previous stage $T_{n+1}$ in the reverse (top) array to inverter I2 and N4 and P4 multiplexes the I1 output to the following stage $B_{n+1}$ in the forward (bottom) array. When the select signal is a logic "0", N1 and P1 multiplex the output of inverter I1 to the input of inverter I2 and N3 and P3 multiplex the output of I2 to the following stage $B_{n+1}$ in the forward (bottom) array. The advantage of this preferred implementation is that circuits can be placed side-by-side on the chip with a minimum interconnection length and each inverter sees only one load for shortest propagation delay and highest resolution.

To demonstrate the efficacy of the invention, a circuit including ten replications of the circuit of FIG. 8 formed at 0.24 micron design rules has been simulated (without parasitics). Under worst case (slow) conditions, a delay of 2.5 nanoseconds was produced in a 1 GHz signal. Delay difference between the forward and feedback signal paths was less than 0.025 nanoseconds (less than 1% of the total delay).

In view of the foregoing, it is seen that the invention provides a delay element with fast set-up capability but which can be fabricated to accommodate any desired maximum delay by replication of a common circuit in a step-and-repeat fashion. The delay of the entire path is measured and programmed during a set-up operation performed with a single signal transition. Resolution is provided of approximately one half the propagation time of a replicable pattern of two delay stages. Implementations in CMOS are relatively insensitive to process variations and propagation time of respective delay stages is not altered by changes in output loading between set-up and normal operation.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A programmable delay element, comprising:
   a plurality of delay stages having substantially equal propagation delay times; and
   means for selectively interconnecting said plurality of delay stages to form one of a first signal propagation path through said delay stages in a first order and a second signal propagation path through said delay stages in a second order to an output terminal, said first signal propagation path having a desired total propagation delay including the same delay stages as said second signal propagation path.

2. A programmable delay element as recited in claim 1, wherein each of said plurality of delay stages includes a multiplexer.

3. A programmable delay element as recited in claim 2, wherein each of said plurality of delay stages includes an inverter.

4. A programmable delay element as recited in claim 1, including means for simultaneously storing output signals of alternating stages in said first signal propagation path.

5. A programmable delay element as recited in claim 1, including means for simultaneously storing output signals of each stage in said first signal propagation path.

6. A programmable delay element as recited in claim 5, further including evaluating means for evaluating output signals of two adjacent stages stored by said storing means and adding a further delay to said second signal path responsive to said means for evaluating.

7. A programmable delay element as recited in claim 5, further including means for evaluating output signals of two adjacent stages stored by said storing means and generating an error signal in response to a combination of logic states of said output signals evaluated by said evaluating means.

8. A programmable delay element as recited in claim 6, wherein said means for evaluating output signals of two adjacent stages stored by said storing means includes means for generating an error signal in response to a combination of logic states of said output signals evaluated by said evaluating means.

9. A programmable delay element as recited in claim 2, wherein said multiplexer includes two transmission gates.

10. A programmable delay element as recited in claim 1, wherein said plurality of delay stages are formed in first and second parallel arrays.

11. A programmable delay element as recited in claim 10, wherein respective delay stages in respective ones of said first and second arrays are formed of identical arrangements of circuit elements.

12. A programmable delay element as recited in claim 10, wherein positionally corresponding delay stages of said first and second arrays form respective pairs of delay stages and wherein each of said respective pairs of delay stages are formed of identical arrangements of circuit elements.

13. A programmable delay element as recited in claim 4, said plurality of delay stages are formed in first and second parallel arrays and a signal propagated along said second propagation path is transferred from said first array to said second array responsive to said means for storing.

14. A programmable delay element as recited in claim 13, wherein said plurality of delay stages are formed in first and second parallel arrays and positionally corresponding delay stages of said first and second arrays form respective pairs of delay stages and wherein each of said respective pairs of delay stages are formed of identical arrangements of circuit elements.

15. A programmable delay element as recited in claim 14, wherein each said delay stage includes an inverter and two transmission gates and in each of said respective pairs of delay stages, an output of one delay stage is connected to an input of a transmission gate of another delay stage in a respective one of said pairs of delay stages.

16. A programmable delay element as recited in claim 15, wherein respective transmissions gates are alternatively enabled in each delay stage and enabled in common for respective delay stages of respective ones of said respective pairs of said delay elements.

17. A method of operating a programmable delay element comprising a plurality of delay stages, said method including steps of:

providing a control circuit which generates a first set of control signals for selectively interconnecting said plurality of delay stages to form a first signal propagation path through said delay stages in a first order, and which generates a second set of control signals for selectively interconnecting said plurality of delay stages to form a second signal propagation path through said delay stages in a second order, said providing step including generating said first set of control signals so that said first signal propagation path has a desired total propagation delay and includes the same delay stages as said second signal propagation path;

outputting one of said first set of control signals and said second set of control signals to respectively form one of said first signal propagation path and second signal propagation path through said plurality of delay stages; and propagating a signal through said delay stages along said signal propagation path formed in said outputting step.

18. A method as recited in claim 17, further comprising:

outputting said first set of control signals to form said first signal propagation path through said delay stages;

propagating said signal through said delay stages along said first signal propagation path;

storing outputs of respective delay stages during said propagating step;

outputting said second set of control signals, including said the outputs stored in said storing step, to form said second signal propagation path through said delay stages; and propagating another signal through said delay stages along said second signal propagation path.

* * * * *